(12) United States Patent
Cascio et al.

(10) Patent No.: US 12,531,534 B2
(45) Date of Patent: Jan. 20, 2026

(54) CURRENT FEEDBACK AMPLIFIER

(71) Applicant: Intel Corporation, Santa Clara, CA (US)

(72) Inventors: Giacomo Cascio, Villach (AT); Martin Clara, Santa Clara, CA (US); Marc Jan Georges Tiebout, Finkenstein (AT); Daniel Gruber, St. Andrae (AT)

(73) Assignee: Intel Corporation, Santa Clara, CA (US)

(*) Notice: Subject to any disclaimer, the term of this patent is extended or adjusted under 35 U.S.C. 154(b) by 881 days.

(21) Appl. No.: 17/645,758

(22) Filed: Dec. 23, 2021

(65) Prior Publication Data

US 2023/0208374 A1 Jun. 29, 2023

(51) Int. Cl.
*H03G 3/30* (2006.01)
*H03F 1/02* (2006.01)
*H03F 3/45* (2006.01)
*H03M 1/18* (2006.01)

(52) U.S. Cl.
CPC ......... *H03G 3/3042* (2013.01); *H03F 1/0222* (2013.01); *H03F 3/45475* (2013.01); *H03M 1/183* (2013.01); *H03F 2200/451* (2013.01); *H03F 2203/45556* (2013.01); *H03F 2203/45562* (2013.01); *H03F 2203/45604* (2013.01)

(58) Field of Classification Search
CPC . H03G 3/3042; H03F 1/0222; H03F 3/45475; H03F 2200/451; H03F 2203/45556; H03F 2203/45562; H03F 2203/45604; H03F 1/42; H03F 3/45237; H03F 2200/72; H03F 2200/91; H03F 3/45264; H03F 3/45636; H03F 3/193; H03M 1/183

USPC ......................................................... 330/252
See application file for complete search history.

(56) References Cited

U.S. PATENT DOCUMENTS

| 5,589,798 A | 12/1996 | Harvey |
| 6,028,479 A | 2/2000 | Babanezhad |
| 2015/0077183 A1* | 3/2015 | Ciubotaru ............ H03G 1/0029 330/254 |

OTHER PUBLICATIONS

Babanezhad J.N.: A 100-MHz, 50-Omega, -45-DB Distortion, 3.3-V CMOS Line Driver for Ethernet and Fast Ethernet Networking Applications. IEEE Journal of Solid-State Circuits, IEEE, USA vol. 34, No. 8, Aug. 1, 1999, pp. 1044-1050, XP000924221, ISSN: 0018-9200, DOI: 10.1109/4.777101.

* cited by examiner

*Primary Examiner* — Andrea Lindgren Baltzell
*Assistant Examiner* — Jose E Pinero
(74) *Attorney, Agent, or Firm* — 2SPL Patent Attorneys PartG mbB; Yong Beom Hwang

(57) ABSTRACT

A current feedback amplifier (CFA). The CFA includes a common-gate input stage, a biasing circuitry, and a differential pair coupled in parallel between the supply voltage node and the reference voltage node. The common-gate input stage amplifies an input signal received at an input node and supplies it to a gate of the complementary transistors of the differential pair. The biasing circuitry supplies a bias voltage to a gate of the transistors of the common-gate input stage. The input node of the common-gate input stage and a node between the complementary transistors in the first path of the differential pair are shorted.

20 Claims, 11 Drawing Sheets

CURRENT FEEDBACK AMPLIFIER

BACKGROUND

A variable-gain amplifier (VGA) is an electronic amplifier that varies its gain depending on a control signal. A VGA is an essential part in the radio frequency (RF) receiver signal chain, implementing a critical function in the RF signal processing and direct sampling applications. The function of the VGA is to address and solve the problem of the received RF signals unavoidably having more dynamic range than the analog-input circuitry can directly withstand, while at the same time not compromising channel resolution (dynamic range). RF input signals can have more (in this case, the VGA attenuates) or less (in this case, the VGA amplifies) dynamic range of the analog-input receiving circuitry. If the signal is very small, the signal could be lost in the inherent noise of the RF signal chain, and consequently the resolution of the signal chain's analog and digital components will be compromised. If the signal is too large, the signal could over-range and saturate components in the signal processing chain, resulting in distortion (e.g., degradation of spurious-free dynamic range (SFDR), interference, settling and recovery-time issues, and data corruption (errors).

BRIEF DESCRIPTION OF THE FIGURES

Some examples of apparatuses and/or methods will be described in the following by way of example only, and with reference to the accompanying figures, in which.

DETAILED DESCRIPTION

Figure 1:
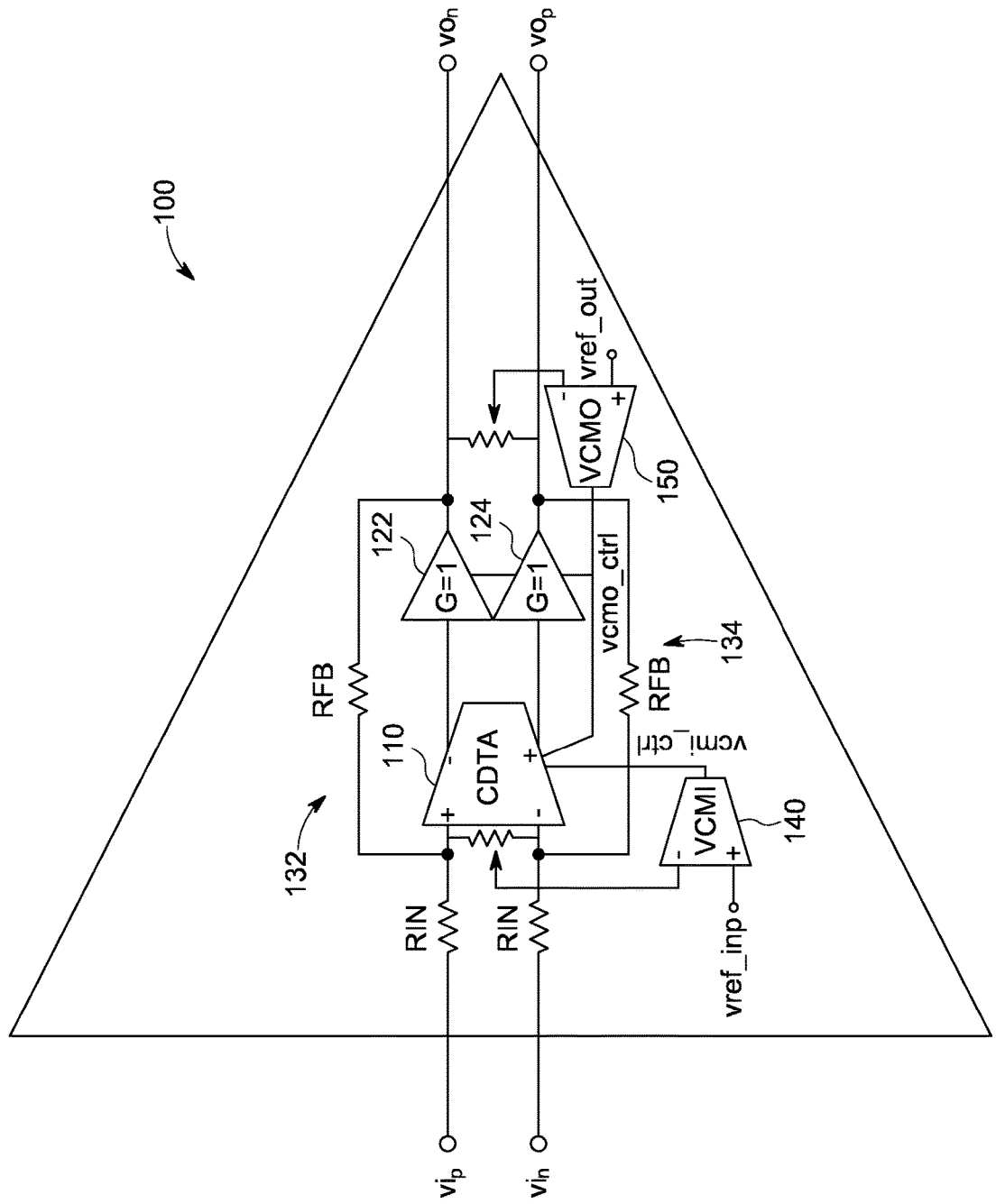
FIG. 1 is a block diagram of an example current feedback amplifier (CFA)

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

The objective of the VGA's function is to amplify a small signal such as a signal from an antenna to fit comfortably within the input range of the next stage in the front-end chain and, if necessary, attenuate the signal if it exceeds that range (e.g., overload situation) through, eventually, an automatic gain control (AGC) loop. There are mainly two VGA categories: an analog VGA and a digital VGA. In analog VGAs, the VGA control is set by an analog parameter (e.g., voltage, current) within a certain range. The gain is a continuous function of the control parameter. In digital VGAs, the gain is set by a digital code. A digital VGA (a programmable gain amplifier (PGA)) will typically have a plurality of control bits (e.g., 4, 6 or 8 bits) of gain-setting resolution, and the key specification of gain is given in dB/step, such as 1 dB/step. The gain of the digital VGA is a discontinuous function of the programming digital input code.

Digital VGAs do not have a smooth, continuous gain-vs.-control relationship, but instead have a step-function relationship with discontinuities due to the digital nature of the control input. The analog control signal for a VGA may come from a digital-to-analog converter (DAC), but often comes from an entirely analog source such as, among others, received signal strength detector (e.g., envelope, peak detector, power meter, etc.).

For RF-focused VGAs, the performance is defined, among others and not limited to, by the following key factors: 1) a gain and a gain range that are function of the likely useable minimum/maximum value of the signal, 2) the equivalent −1 dB (or −3 dB) bandwidth (roll-off) and operating frequency that should match the bandwidth of the signal, 3) the small signal transfer function that should have a flat-enough response across some sub-segment of the −3 dB bandwidth, 4) a noise figure, 5) the input/output third-order intercept point (IIP3/OIP3) which is a calculated metric indicating the linearity of the VGA function. 6) log conformity that is analogous to linearity for a conventional op-amp and indicates how closely the VGA transfer function adheres to the ideal curve response, 7) aging, mechanical stress, temperature coefficient and drift, which are particularly relevant with high gain setting (small variations can have a large effect on performance), 8) power-supply rail and dissipation. With the scaling down of complementary metal-oxide-semiconductor (CMOS) technology, lower-voltage rails are attractive due to lower dissipation and better compatibility (e.g., with digital processing unit), but they have reduced signal headroom, less noise margin.

In a multi-GHz front-end case, VGA limitations such as, among others, bandwidth, linearity, noise, signal/power integrity (e.g., electromagnetic interference (EMI), power-supply rejection ratio (PSRR), common mode rejection ratio (CMRR), reverse isolation, etc.), generally set the barrier for the overall system performance. With the advance of technology scaling, along with superior technical and specification attributes, the VGAs are smaller and dissipate less power than their discrete predecessors. Therefore, users are getting better products, and the success of these products is reflecting back and pushing demands for even better VGAs, in a virtuous feedback cycle.

Possible solutions to solve the problem and address the VGA function in direct RF sampling applications are, among others, the following: 1) use a voltage feedback amplifier (VFA), for example a multi-stage op-amp, 2) use an external discrete block in different technology (e.g., SiGe, SOI SiCMOS, GaN etc.), or 3) use software for controlling and scaling (digitally) the gain or the attenuation level.

Disadvantage of using a VFA is the gain-bandwidth limitation. In general, in an application that sets a fixed voltage gain by means of negative feedback, the feedback impedance affects the VFA's closed-loop gain as well as its bandwidth. Basically, the product of the two (called a gain-bandwidth product) is constant (fixed by design), and for any given real-world VFA, designers should trade off gain for bandwidth, or vice versa. Using a VFA as VGA, changing the gain will change the equivalent receiving channel bandwidth and this can be seen as a critical issue for direct sampling applications.

Another VFA's limitation is a slew-rate, or how well its output can follow fast (rapid) voltage changes on the input. It is related to the amount of available current to charge-discharge internal compensation capacitors. Slew-rate limitations are important because they affect key performance parameters such as, among others and not limited to, total harmonic distortion (THD), and the spurious-free dynamic range (SFDR) which will define the effective number of bits (ENOB) of a downstream direct sampling analog-to-digital converter (ADC). To achieve high slew-rate using a VFA, it is necessary to invest significant amount of DC current (quiescent current) which leads to power penalty and other disadvantages (e.g., thermal/power dissipation, increased area, product reliability over life-time etc.).

Using a discrete external VGA block leads to increase the overall cost, bill of material, board complexity (e.g., printed circuit board (PCB) layout routing), etc. Available discrete solutions are often power-hungry and generally not suitable for high level of integration.

Digital compensation (via software) generally allows small correction and can help scaling up/down, in a limited range (few dB), in case the input signal strength has typical (or close to) target values. In extreme cases, if the signal is too strong (overload situation, above full-scale) or is too weak (approaching a noise floor), the digital correction cannot effectively help to re-center the signal for a proper sampling and acquisition.

Examples are disclosed for a current-mode feedback amplifier. For a current-mode feedback amplifier, the operating variable becomes current rather than voltage such that voltage swings could be kept small (increased linearity) while permitting large swings in the signal currents, overcoming VFA gain-bandwidth conflict. The current feedback amplifier may be used for RF frequencies and analog signal processing.

FIG. 1 is a block diagram of an example current feedback amplifier (CFA) 100. The amplifier 100 includes a current differencing transconductance amplifier (CDTA) 110, output buffers 122, 124, feedback paths 132, 134, and common-mode input and output voltage control loops including two independent operational transconductance amplifiers (OTAs) 140, 150 (namely VCMI, and VCMO). The amplifier 100 may have a programmable dominant pole (and zero) compensation to ground (GND) at the output of the second stage of amplification (e.g., at the output of CDTA block 110).

The CDTA 110 may include two input nodes for receiving differential input signals and two output nodes for outputting differential output signals. One input node may be a non-inverting input node of the CDTA 110 and the other input node may be an inverting input node of the CDTA 110. In examples, the CDTA 110 may include a dual (complementary) common-gate input stage, followed by a dual (complementary) differential pair.

The output buffers 122, 124 may be coupled to the output nodes of the CDTA 110. A first output buffer 122 may be coupled to a non-inverting output node of the CDTA 110, and a second output buffer 124 may be coupled to an inverting output node of the CDTA 110. Each output buffer 122, 124 may comprise, for example, a source follower circuit (common drain amplifier). Alternatively, other topologies can be used for buffering the output voltage. An input node of the output buffer 122, 124 is coupled to an output node of the CDTA 110. Each output buffer 122, 124 receives an output signal of the CDTA 110 and generates a buffer output signal based on the output signal of the CDTA 110.

Feedback paths 132, 134 may be formed from the output nodes of the output buffers 122, 124 to the input nodes of the CDTA 110. A first feedback path 132 may be formed from the output node of the first output buffer 122 coupled to the inverting output node of the CDTA 110 to the non-inverting input node of the CDTA 110, and a second feedback path 134 may be formed from the output node of the second output buffer 124 coupled to the non-inverting output node of the CDTA 110 to the inverting input node of the CDTA 110.

Each of the first and second feedback paths 122, 124 may comprise a resistive element configured to generate a feedback current based on the buffer output signal. In other examples, each of the first and second feedback paths 122, 124 may comprise a capacitive element instead or in addition to the resistive element. The resistive element may be a single resistor as illustrated in FIG. 1 or comprise a plurality of coupled resistors. For example, the resistive element may comprise a plurality of switchable resistors such that a resistance of the resistive element is adjustable by selectively coupling one or more of the plurality of switchable resistors based on one or more control signals. Similarly, the capacitive element may be a single capacitor or comprise a plurality of coupled capacitors. For example, the capacitive element may comprise a plurality of switchable capacitors such that a capacitance of the capacitive element is adjustable by selectively coupling one or more of the plurality of switchable capacitors based on one or more control signals.

Two independent OTAs 140, 150 (VCMI, VCMO) may be used to set the input and output common-mode voltage (programmable). This solution is particularly suitable for applications requiring high bandwidth and slew-rate such as a front-end RF buffer, an RF amplifier both directions possible (RX and TX), an active RF filter stage, etc.

Figure 2:
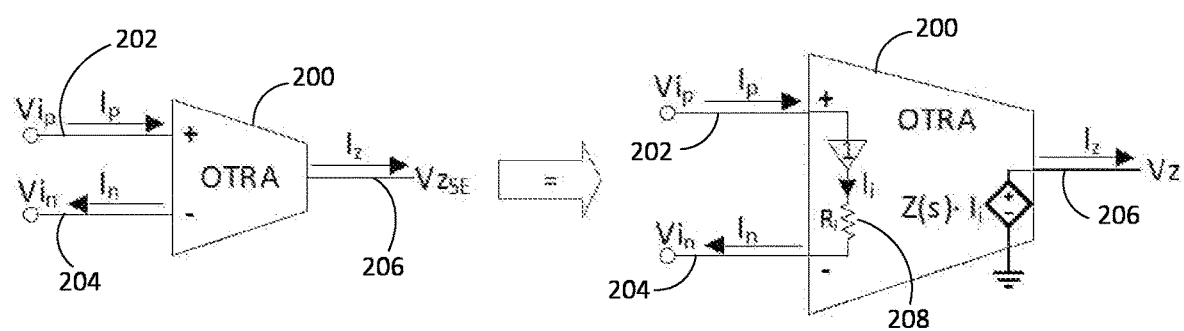
FIG. 2 is a block diagram of an example operational trans-resistance amplifier (OTRA) with a single-ended structure.

FIG. 2 is a block diagram of an example operational trans-resistance amplifier (OTRA) with a single-ended structure. An OTRA 200 has two low-impedance inputs 202, 204 (virtual ground, current bi-directional) and one low-impedance output 206. Since both input and output terminals of an OTRA are characterized by low-impedance, the OTRA offers the advantage of eliminating response limitations (e.g., reduced bandwidth, slew-rate) incurred by parasitic capacitances.

A current feedback amplifier can be seen as current-sensing of the two input currents ($I_p$-$I_n$ in FIG. 2) at its input terminals through a trans-linear input mesh. A key figure of merit of a current feedback stage is the equivalent input resistance ($R_i$ 208 in FIG. 2) which sets the sensitivity of the CFA. The lower, the better. The differential input current (sensed) is then amplified and converted into an output voltage by the equivalent trans-impedance (Z(s) in FIG. 2). Essentially, the trans-impedance of the CFA is also a figure of merit (similar to VFA's open-loop gain), determining the operating gain range (max) of the VGA.

The minimization of the CFA's equivalent input resistance ($R_i$) 208 can impose a significant current investment, leading to power penalty. The new architecture disclosed herein overcomes this problem, offering an ultra-low impedance of the input stage without compromising power budget.

Figure 3:
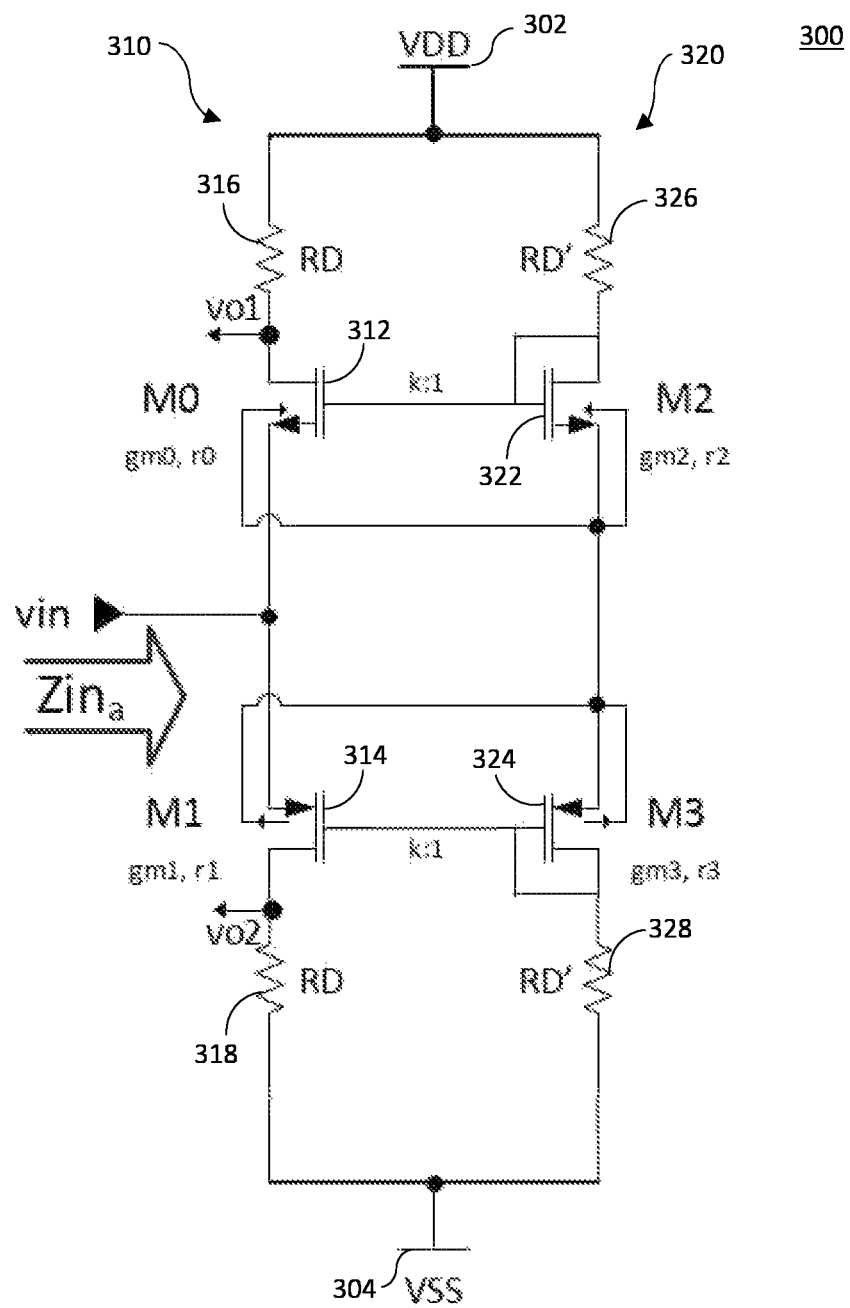
FIG. 3 shows an example current feedback input stage of an amplifier.

FIG. 3 shows an example current feedback input stage 300 of an amplifier. The input stage 300 includes a first path 310 and a second path 320. The first path 310 and the second path 320 are coupled in parallel between a voltage supply input node 302 configured to receive a voltage supply signal (e.g., a positive supply voltage $V_{DD}$) and a reference supply input node 304 configured to receive a reference supply signal (e.g., a negative supply voltage $V_{SS}$ or ground).

The first path 310 is a common gate input stage. The first path 310 comprises a transistor 312 and a transistor 314 coupled in series. The source terminals of the transistor 312 and the transistor 314 are coupled to the input node of the amplifier (e.g., the input node of the CDTA 100). The drain terminal of the transistor 312 is coupled to the voltage supply input node 302. The drain terminal of the transistor 314 is coupled to the reference supply input node 304.

The second path 320 is biasing circuitry configured to supply a first bias signal to the gate terminal of the transistor 312 and a second bias signal to the gate terminal of the transistor 314. Accordingly, the transistors 312 and 314 may be kept in a conductive state fixing the quiescent (operating) DC point of the common-gate stages.

The second path 320 comprises a transistor 322 and a transistor 324 coupled in series. In particular, the source terminals of the transistor 322 and the transistor 324 are coupled in series. The drain terminal of the transistor 322 is coupled to the voltage supply input node 302 and the gate terminal of the transistor 322. The drain terminal of the transistor 324 is coupled to the reference supply input node 304 and the gate terminal of the transistor 324. The gate terminal of the transistor 322 is coupled to the gate terminal of the transistor 312. The gate terminal of the transistor 324 is coupled to the gate terminal of the transistor 314.

The bulk terminals of the transistor 312 and the transistor 322 are coupled with each other. Further, the bulk terminals of the transistor 312 and the transistor 322 are coupled with the source terminal of the transistor 322. Analogously, the bulk terminals of the transistor 314 and the transistor 324 are coupled with each other. Further, the bulk terminals of the transistor 314 and the transistor 324 are coupled with the source terminal of the transistor 324.

The transistors 312 and 322 are of a first conductivity type and the transistors 314 and 324 are of a different second conductivity type. In the example of FIG. 3, the transistors 312 and 322 are n-type (n-channel) transistors and the transistors 314 and 324 are p-type (p-channel) transistors. However, the examples are not limited thereto. In other examples, the transistors 312 and 322 may be p-type (p-channel) transistors and the transistors 314 and 324 may be n-type (n-channel) transistors.

A respective resistive element 316, 318 of a predetermined resistance RD may be coupled between the drain terminal of the transistor 312 and the voltage supply input node 302 and the drain terminal of the transistor 314 and the reference supply input node 304, respectively. A respective resistive element 326, 328 of a predetermined resistance RD' may be coupled between the drain terminal of the transistor 322 and the voltage supply input node 302 and the drain terminal of the transistor 324 and the reference supply input node 304, respectively. Each of the resistive elements 316, 318, 326, 328 may be a single resistor or comprise a plurality of coupled resistors, for example, to improve the matching.

The common gate stage (i.e., the path 310) offers a first amplification of the input signal (e.g., a differential input signal pair) received at the input nodes of the amplifier (e.g., the input nodes of the CDTA 110). In examples, the common gate input stage(s) is followed by a differential pair(s) with resistive degenerated source terminals.

Figure 4:
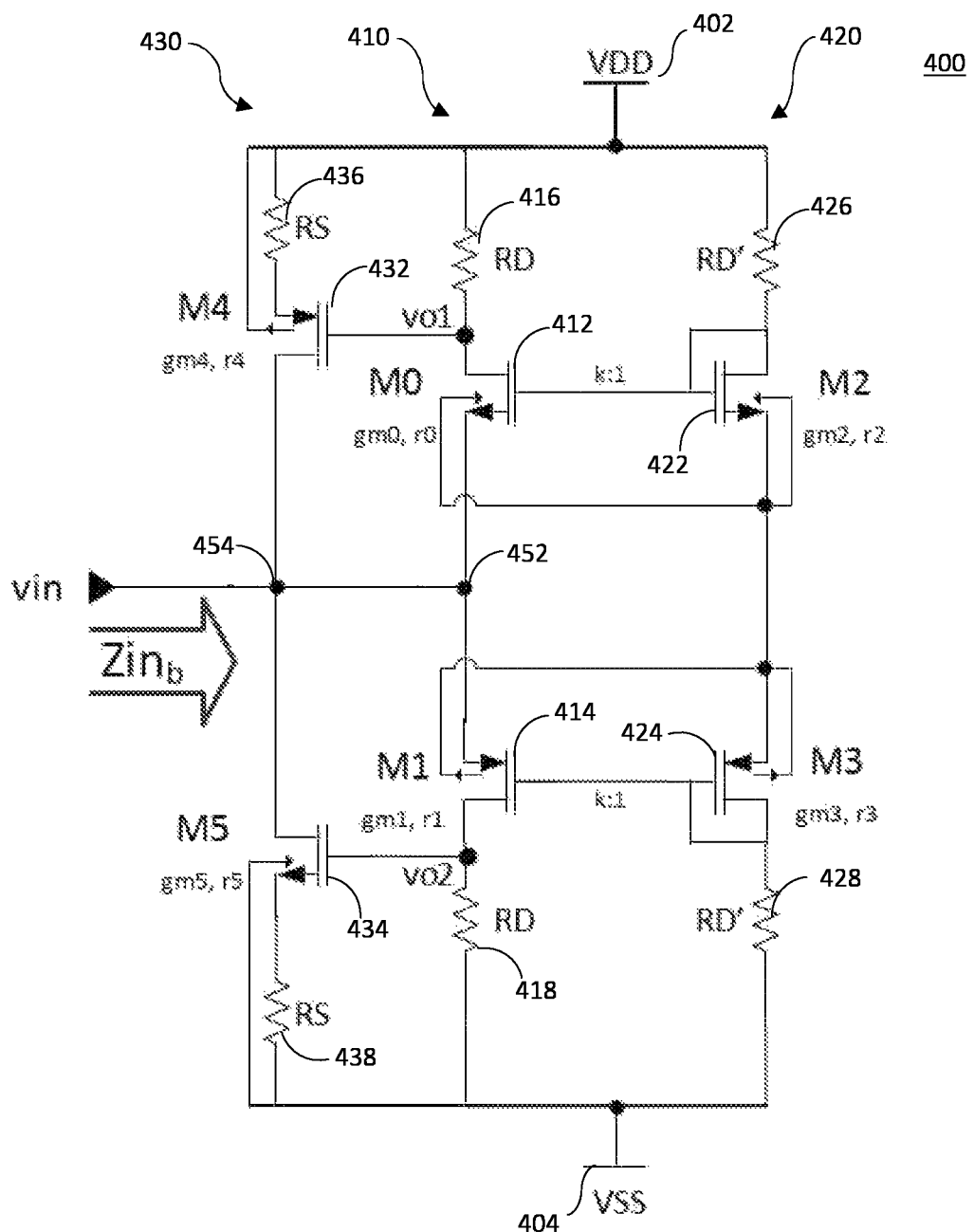
FIG. 4 shows an example current feedback input stage in accordance with some examples.

FIG. 4 shows an example current feedback input stage 400 in accordance with some examples. It is a complementary common-gate input stage in class AB amplifiers. It is fully symmetric to equally split voltage drops and equalize the impedance. The input currents can be bidirectional.

The input stage 400 includes a first path 410, a second path 420, and a third path 430 that are coupled in parallel between a voltage supply input node 402 configured to receive a voltage supply signal (e.g., a positive supply voltage $V_{DD}$) and a reference supply input node 404 configured to receive a reference supply signal (e.g., a negative supply voltage $V_{SS}$ or ground).

The first path 410 is a common gate input stage. The first path 410 comprises a transistor 412 and a transistor 414 coupled in series. The source terminals of the transistor 412 and the transistor 414 are coupled in series. The input node 452 in the first path 410 is coupled to the input terminal of the amplifier (e.g., the CDTA 110). The drain terminal of the transistor 412 is coupled to the voltage supply input node 402. The drain terminal of the transistor 414 is coupled to the reference supply input node 404.

The second path 420 is biasing circuitry configured to supply a first bias signal to the gate terminal of the transistor 412 and a second bias signal to the gate terminal of the transistor 414. Accordingly, the transistors 412 and 414 may be kept in a conductive state.

The second path 420 comprises a transistor 422 and a transistor 424 coupled in series. The source terminals of the transistor 422 and the transistor 424 are coupled in series. The drain terminal of the transistor 422 is coupled to the voltage supply input node 402 and the gate terminal of the transistor 422. The drain terminal of the transistor 424 is coupled to the reference supply input node 404 and the gate terminal of the transistor 424. The gate terminal of the transistor 422 is coupled to the gate terminal of the transistor 412. The gate terminal of the transistor 424 is coupled to the gate terminal of the transistor 414.

The bulk terminals of the transistor 412 and the transistor 422 are coupled with each other. Further, the bulk terminals of the transistor 412 and the transistor 422 are coupled with the source terminal of the transistor 422. Analogously, the bulk terminals of the transistor 414 and the transistor 424 are coupled with each other. Further, the bulk terminals of the transistor 414 and the transistor 424 are coupled with the source terminal of the transistor 424.

The third path 430 comprises a transistor 432 and a transistor 434 coupled in series. The drain terminals of the transistor 432 and the transistor 434 are coupled in series. The source terminal of the transistor 432 is coupled to the voltage supply input node 402. The source terminal of the transistor 434 is coupled to the reference supply input node 404. The drain terminal of the transistor 412, which is one output node (vo1) of the input stage, is coupled to the gate of the transistor 432 and the drain terminal of the transistor 414, which is another output node (vo2) of the input stage, is coupled to the gate of the transistor 434. The input node 452 of the common-gate input stage (the first path 410) and the node 454 between the transistors 432 and 434 in the third path 430 are shorted, which forms a local feedback loop to minimize the equivalent input impedance seen at the input terminals.

The transistors 412, 422, and 434 are of a first conductivity type and the transistors 414, 424, and 432 are of a different second conductivity type. In the example of FIG. 4, the transistors 412, 422, and 434 are n-type (n-channel) transistors and the transistors 414, 424 and 432 are p-type (p-channel) transistors. However, the present disclosure is not limited thereto. In other examples, the transistors 412, 422, and 434 may be p-type (p-channel) transistors and the transistors 414, 424, and 432 may be n-type (n-channel) transistors.

A respective resistive element 416, 418 of a predetermined resistance RD may be coupled between the drain terminal of the transistor 412 and the voltage supply input node 402 and the drain terminal of the transistor 414 and the reference supply input node 404, respectively. A respective resistive element 426, 428 of a predetermined resistance RD' may be coupled between the drain terminal of the transistor 422 and the voltage supply input node 402 and the drain terminal of the transistor 424 and the reference supply input node 404, respectively. A respective resistive element 436, 438 of a predetermined resistance RS may be coupled between the source terminal of the transistor 432 and the voltage supply input node 402 and the source terminal of the transistor 434 and the reference supply input node 404, respectively. Each of the resistive elements 416, 418, 426, 428, 436, 438 may be a single resistor or comprise a plurality of coupled resistors.

The equivalent input impedance ($Zin_a$ and $Zin_b$ in FIGS. 3 and 4) seen at the input terminal (yin) is the parallel of the two complementary paths. It can be (analytically) demonstrated that it is equal to the following expressions:

$$Zin_a \approx \frac{1}{g_{m0} + g_{m1}}, \quad \text{Equation (1)}$$

$$Zin_b \approx \frac{1}{(g_{m0} + g_{m1}) \cdot \left(1 + \frac{R_D}{R_S}\right)}. \quad \text{Equation (2)}$$

$g_{m0}$ and $g_{m1}$ are the transconductance of the transistors 412 and 414, respectively.

From the derived Equations (1) and (2), it can be shown that the topology in FIG. 4 offers a significant reduction of the input impedance given be the amplification factor ($1+R_D/Rs$), without compromising the current budget.

$Zin_b$ in the input stage in FIG. 4 can be controlled well over process and temperature due to the ratio of the resistors. The gain of the two topologies in FIGS. 3 and 4 from the input terminal yin to the dual output terminals vo1 and vo2 is equivalent and can be expressed by the following relationships:

$A_{vo1} \approx g_{m0} \cdot R_D$, if $r_0 \gg R_D$, and $A_{vo2} \approx g_{m1} \cdot R_D$, if $r1 \gg R_D$. $\quad$ Equation (3)

Figure 5:
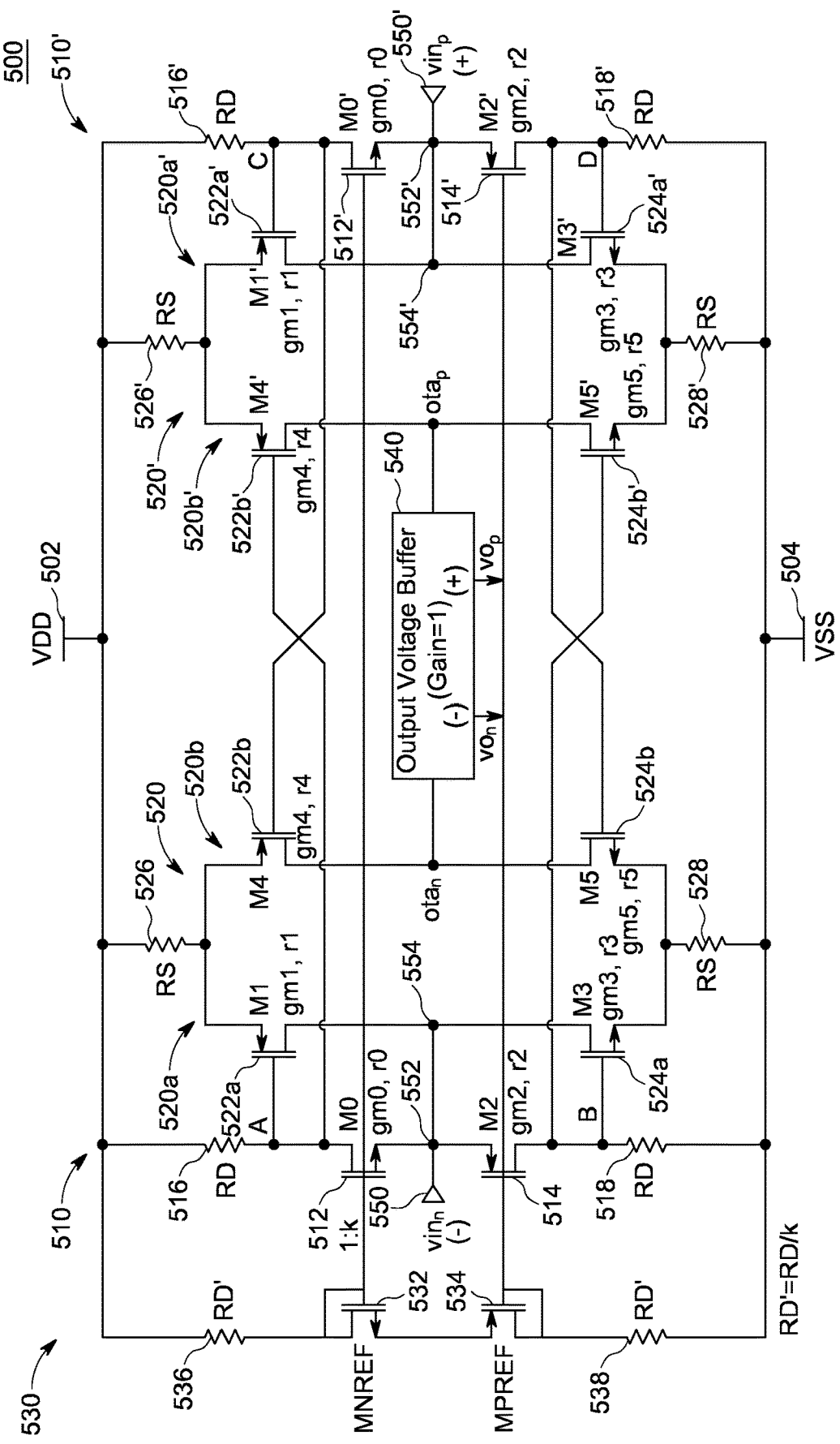
FIG. 5 shows an example of a fully differential current feedback amplifier with a resistive load of common-gate input stage and source degeneration of complementary differential pairs.

FIG. 5 shows an example of a fully differential current feedback amplifier 500 with a resistive load of common-gate input stage and source degeneration of complementary differential pairs. The amplifier 500 has a symmetric architecture and includes a first stage and a second stage. The first stage includes a complementary common-gate input stages (paths 510, 510') (M0-M2 and M0'-M2') with resistive load RD and local feedback loops (M1-M3 and M1'-M3') to minimize the equivalent input impedance seen at the input terminals 550, 550', as expressed in the Equation (2). The small-signal gain of the first stage can be approximated with the Equation (3).

The second stage includes a complementary differential pair 520, 520' (M1-M3-M4-M5 and M1'-M3'-M4'-M5') having source degenerated to enhance linearity. Gate control signals of the complementary differential pair 520, 520' are the pre-amplified output of the first stage 510, 510' (nodes A, B, C, D) and decoupled from the input terminals. The transistors of the differential pairs 520, 520' and the common-gate input stages 510, 510' are cross-coupled. The cross-coupled implementation of the transistor 522b M4 (connected to node C)—the transistor 522b' M4' (connected to node A) and the transistor 524b M5 (connected to node D)—the transistor 524b' M5' (connected to node B) provides proper biasing to the differential pair and further amplification of the signal toward the differential outputs ($ota_n$ and $ota_p$).

The complementary common-gate input stages 510, 510' and the complementary differential pairs 520, 520', and the biasing circuitry 530 are coupled in parallel between a voltage supply input node 502 configured to receive a voltage supply signal (e.g., a positive supply voltage $V_{DD}$) and a reference supply input node 504 configured to receive a reference supply signal (e.g., a negative supply voltage $V_{SS}$ or ground).

The common-gate input stage 510 includes a transistor 512 and a transistor 514 coupled in series. The source terminals of the transistor 512 and the transistor 514 are coupled in series and coupled to the first input terminal 550 of the amplifier 500. The drain terminal of the transistor 512 is coupled to the voltage supply input node 502. The drain terminal of the transistor 514 is coupled to the reference supply input node 504.

The common-gate input stage 510' includes a transistor 512' and a transistor 514' coupled in series. The source terminals of the transistor 512' and the transistor 514' are coupled in series and coupled to the second input terminal 550' of the amplifier 500. The drain terminal of the transistor 512' is coupled to the voltage supply input node 502. The drain terminal of the transistor 514' is coupled to the reference supply input node 504.

A differential pair 520 includes a first path 520a and a second path 520b coupled in parallel between two resistors 526, 528. The first path 520a includes a transistor 522a and a transistor 524a coupled in series. The drain terminals of the transistor 522a and the transistor 524a are coupled in series. The source terminal of the transistor 522a is coupled to the voltage supply input node 502. The source terminal of the transistor 524a is coupled to the reference supply input node 504. The second path 520b includes a transistor 522b and a transistor 524b coupled in series. The drain terminals of the transistor 522b and the transistor 524b are coupled in series. The source terminal of the transistor 522b is coupled to the voltage supply input node 502. The source terminal of the transistor 524b is coupled to the reference supply input node 504. A differential output (ota$_n$) is taken from the drain terminal of the transistor 522b, 524b. The input node 552 of the common-gate input stage 510 and the node 554 between the transistors 522a and 524a in the first path 520a are shorted, which forms a local feedback loop to reduce the input equivalent impedance, enhancing CFA bandwidth and less sensitivity to parasitic input capacitance.

A differential pair 520' includes a first path 520a' and a second path 520b' coupled in parallel between two resistors 526', 528'. The first path 520a' includes a transistor 522a' and a transistor 524a' coupled in series. The drain terminals of the transistor 522a' and the transistor 524a' are coupled in series. The source terminal of the transistor 522a' is coupled to the voltage supply input node 502. The source terminal of the transistor 524a' is coupled to the reference supply input node 504. The second path 520b' includes a transistor 522b' and a transistor 524b' coupled in series. The drain terminals of the transistor 522b' and the transistor 524b' are coupled in series. The source terminal of the transistor 522b' is coupled to the voltage supply input node 502. The source terminal of the transistor 524b' is coupled to the reference supply input node 504. Another differential output (ota$_p$) is taken from the drain terminal of the transistor 522b', 524b'. The input node 552' of the common-gate input stage 510' and the node 554' between the transistors 522a' and 524a' in the path 520a' are shorted, which forms a local feedback loop to reduce the input equivalent impedance, enhancing CFA bandwidth and less sensitivity to parasitic input capacitance.

The path 530 is biasing circuitry configured to supply a first bias signal to the gate terminal of the transistor 512 and 512' and a second bias signal to the gate terminal of the transistor 514 and 514'. Accordingly, the transistors 512, 512' and 514, 514' may be kept in a conductive state. The path 530 comprises a transistor 532 and a transistor 534 coupled in series. In particular, the source terminals of the transistor 532 and the transistor 534 are coupled in series. The drain terminal of the transistor 532 is coupled to the voltage supply input node 502 and the gate terminal of the transistor 532. The drain terminal of the transistor 534 is coupled to the reference supply input node 504 and the gate terminal of the transistor 534. The gate terminal of the transistor 532 is coupled to the gate terminal of the transistor 512, 512'. The gate terminal of the transistor 534 is coupled to the gate terminal of the transistor 514, 514'.

The drain terminal of the transistor 512 is coupled to the gate of the transistor 522a and 522b' and the drain terminal of the transistor 512' is coupled to the gate of the transistor 522b and 522a'. The drain terminal of the transistor 514 is coupled to the gate of the transistor 524a and 524b' and the drain terminal of the transistor 514' is coupled to the gate of the transistor 524b and 524a'.

The transistors 512, 512', 524a, 524a', 524b, 524b', 532 are of a first conductivity type and the transistors 514, 514', 522a, 522a', 522b, 522b', 534 are of a different second conductivity type. In the example of FIG. 5, the transistors 512, 512', 524a, 524a', 524b, 524b', 532 are n-type (n-channel) transistors and the transistors 514, 514', 522a, 522a', 522b, 522b', 534 are p-type (p-channel) transistors. However, the present disclosure is not limited thereto. In other examples, the transistors 512, 512', 524a, 524a', 524b, 524b', 532 may be p-type (p-channel) transistors and the transistors 514, 514', 522a, 522a', 522b, 522b', 534 may be n-type (n-channel) transistors.

A respective resistive element 516, 516', and 518, 518' of a predetermined resistance RD may be coupled between the drain terminal of the transistor 512, 512' and the voltage supply input node 502 and the drain terminal of the transistor 514, 514' and the reference supply input node 504, respectively. A respective resistive element 536, 538 of a predetermined resistance RD' may be coupled between the drain terminal of the transistor 532 and the voltage supply input node 502 and the drain terminal of the transistor 534 and the reference supply input node 504, respectively. A respective resistive element 526, 526', 528, 528' of a predetermined resistance RS may be coupled between the source terminal of the transistor 522a/522b, 522a'/522b' and the voltage supply input node 502 and the source terminal of the transistor 524a/524b, 524a'/524b' and the reference supply input node 504. Each of the resistive elements may be a single resistor or comprise a plurality of coupled resistors.

The amplifier 500 may include an output buffer 540. The output buffer 540 represents the driving stage and can be voltage (V/V) or current mode (V/I), depending on the application or requirements. In some examples, the output buffer 540, for direct sampling ADC, may be a source follower having a low output impedance for driving highly non-linear sampling loads (e.g., samplers of an analog-to-digital converter (ADC)). The output stage of the amplifier (CFA) may be chosen in accordance with the specific application. For example, if the VGA (or RF buffer) is used to drive the sampling network of sub-ADCs in a multi-giga samples per second direct sampling ADC, a class AB source follower may be a good choice, offering low output impedance, high current driving capability, wide bandwidth, and modularity.

Figure 6:
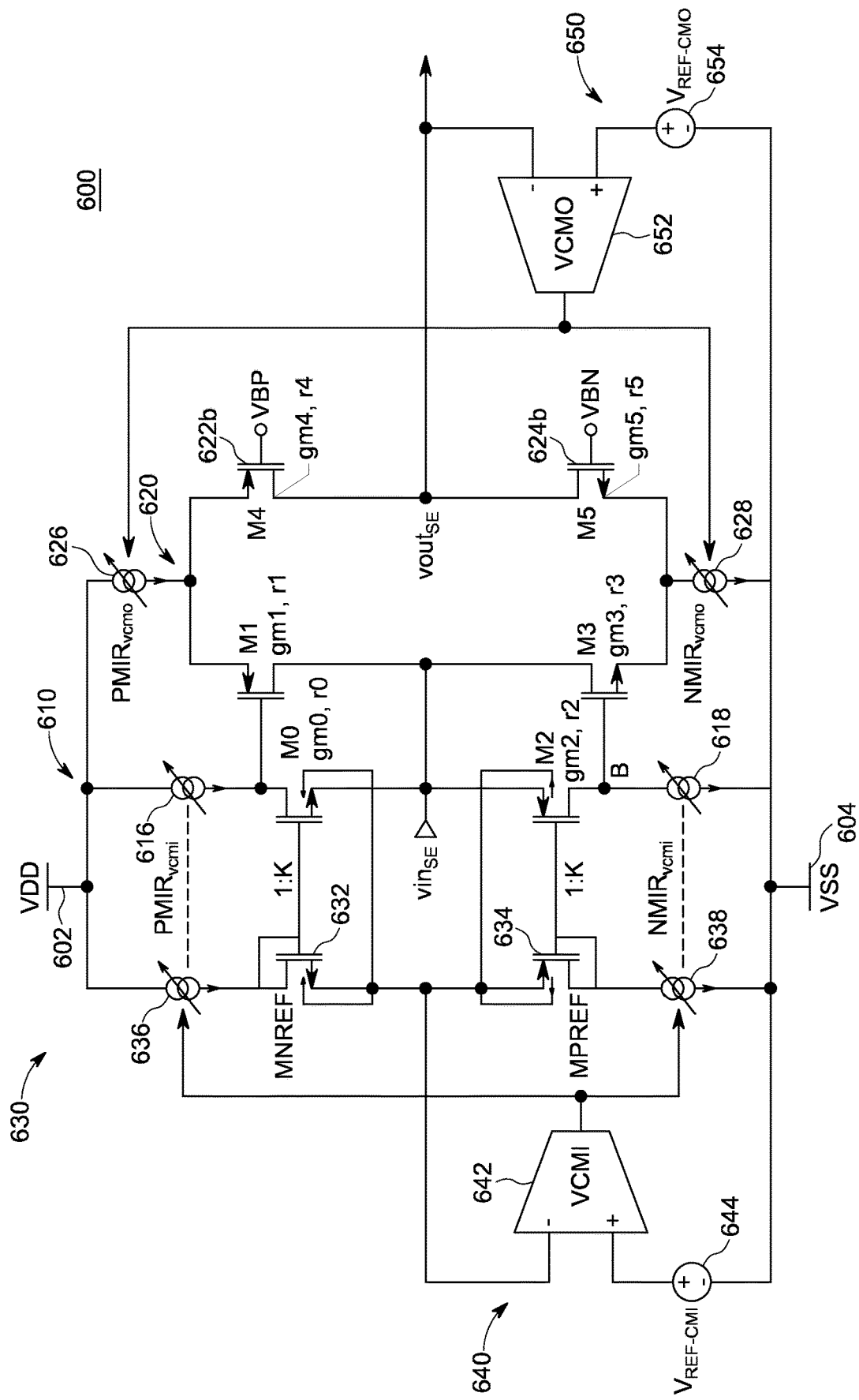
FIG. 6 shows a single-ended representation of another example current feedback amplifier.

The amplifier may include a common-mode input and/or output voltage control loop using a dedicated low-drop regulator to set the supply voltage ($V_{DD}$) of the CFA. FIG. 6 shows a single-ended representation of another example current feedback amplifier 600. The configuration of this amplifier 600 is similar to the amplifier 400 in FIG. 4 or the left half of the amplifier 500 in FIG. 5. Therefore, the same components will not be explained again for simplicity. The amplifier 600 further includes the input and output common-mode voltage control loops 640, 650. In addition, the resistive loads 516, 516', 518, 518', 526, 526', 528, 528' of the common-gate input stage 510, 510' and the complementary differential pair 520, 520' in FIG. 5 are replaced with the active loads 616, 618, 626, 628, 636, 638 (e.g., a variable current source) that are controlled by means of the two control loops 640, 650, regulating (independently) the DC operating conditions of the first and second CFA stages, i.e., the paths 610, 620, and 630.

The common-mode input voltage control loop 640 includes an operational amplifier 642. The inverting input of the operational amplifier 642 is coupled to the source terminal of the transistors 632 and 634, and the non-inverting input of the operational amplifier 642 is coupled to the input common-mode reference voltage 644, and the difference is amplified and fed as a control signal to the active loads 636, 638, 616, 618 (e.g., a variable current source). The inverting input of the operational amplifier 652 is coupled to the output node of the amplifier (e.g., the drain terminal of the transistors 622b, 624b, or the output of the output buffer 540), and the non-inverting input of the operational amplifier 652 is coupled to the output common mode reference voltage 654, and the difference is amplified and fed as a control signal to the active loads 626 and 628 (e.g., a variable current source). The operational amplifiers 642, 652 allow input impedance tuning (via input bias current), independent input and output common-mode voltage control (OTAs VCMI/O), and gain-boosting due to the active loads.

The active loads 616, 618 connected to the common-gate input stage 610 offer the following advantages. It provides gain boosting. From Equation (3), RD becomes the output impedance of the current mirror (P/NMIRvcmi). It allows an independent input common-mode voltage control (in DC). It also allows the change of the biasing current, therefore tuning transconductance of the input stage to best fit the application requirements (e.g., Zin, noise, bandwidth, current consumption).

The active loads 626, 628 biasing the complementary differential pairs 620 (the second stage) give the following advantages. It improves common-mode rejection and boosted small-signal gain of the second stage. It provides flexibility to vary the bias current (namely P/NMIRvcmo), changing the bandwidth of the second stage (dominant pole placed at voutSE). It can also control the common-mode output voltage, in case of fully-differential implementation.

Figure 7:
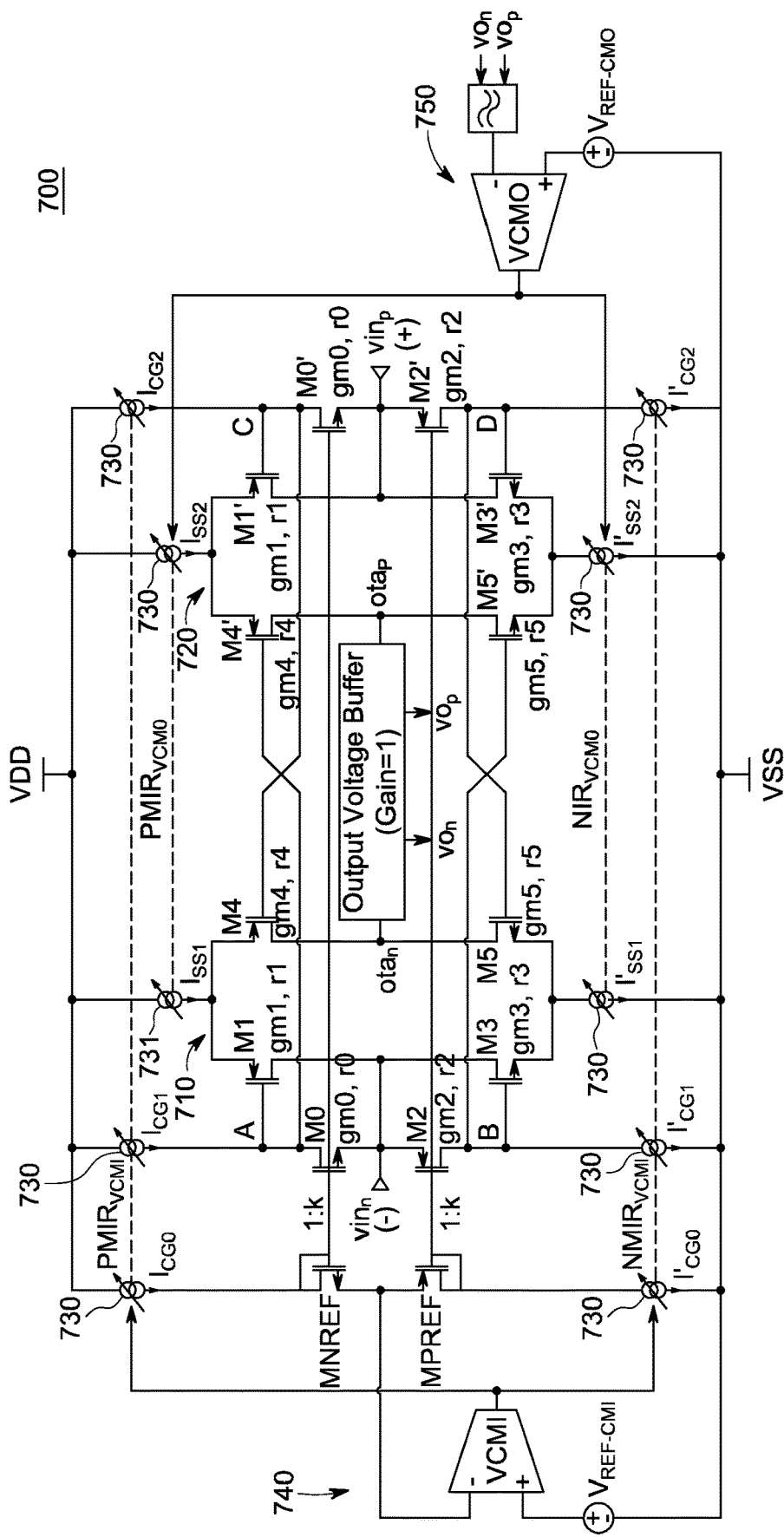
FIG. 7 shows a fully differential current feedback amplifier with the active loads for gain boosting and the input and output common-mode voltage control loops.

FIG. 7 shows a fully differential current feedback amplifier 700 with the active loads for gain boosting and the input and output common-mode voltage control loops. The exemplary circuitry shown in FIG. 7 merges all schemes disclosed above. The amplifier 700 includes the nested inner input feedback loops M0-M1-M2-M3 (and M0'-M1'-M2'-M3') that allows a significant reduction (Equation (2)) of the equivalent CFA's input resistance (Ri in FIG. 2) achieving higher sensitivity in the current-sensing process and less susceptibility to the parasitic capacitances. The amplifier 700 has a fully symmetric cross-coupled complementary differential pairs 710, 720 (the second stage) which contribute to increase the trans-impedance (or equivalently the open-loop gain) of the stage (relevant for VGA). The complementary active loads 730 boost the gain, giving the possibility to tune the bias current for an application-oriented optimization, changing the overall CFA's current consumption (e.g., noise, bandwidth, slew-rate etc.), compensation of process technology or temperature variations in case the bias current (730) is a function (dependent) with a specific relationship vs. temperature and process variation. The two independent control loops 740, 750 regulate the input and output common-mode voltage as explained above. The compensation network (for stability) may be added at the two differential amplifier outputs (namely $ota_n$ and $ota_p$) referred to ground, for an easy and straightforward integration.

In some examples, the amplifier may include a stability compensation network. A compensation network may be added at the outputs of the amplifier (namely $ota_n$ and $ota_p$). The stability compensation network may be implemented using an array of binary-scaled capacitors (digitally controlled) connected to the two outputs ($ota_n$ and $ota_p$) and referred to ground. This implementation is easy to integrate and offers digital control of CFA's bandwidth and frequency response (e.g., tune the bandwidth for improving system performance).

Figure 8:
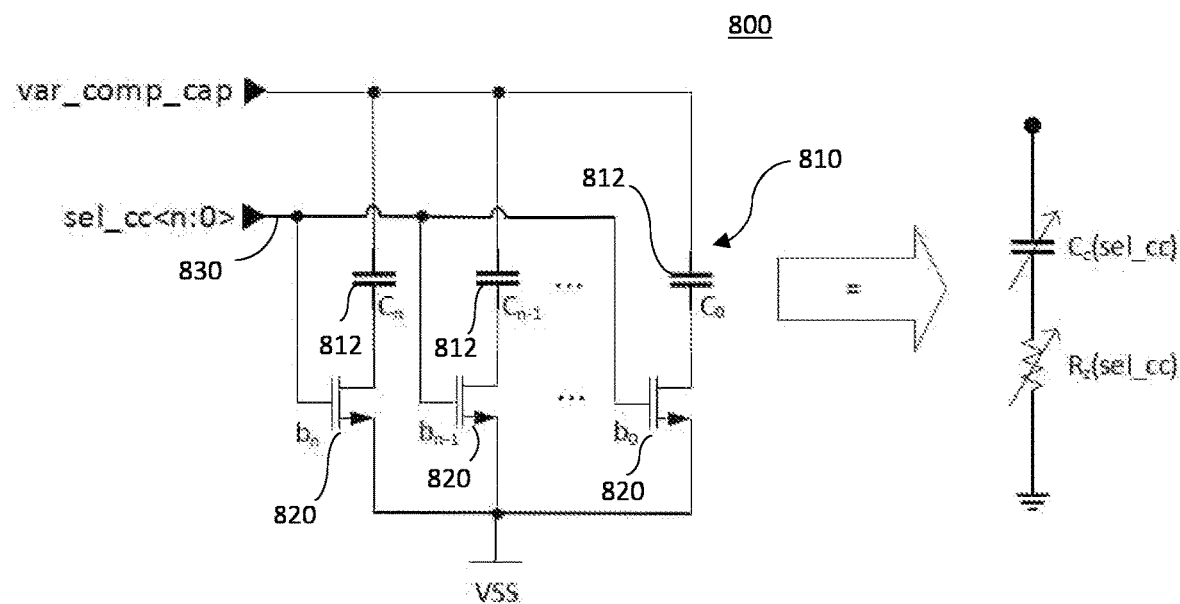
FIG. 8 shows an example implementation of the programmable compensation network.

FIG. 8 shows an example implementation of the programmable compensation network 800. The compensation network 800 includes a capacitor array 810 including a plurality of capacitors 812 coupled in parallel and a plurality of switches 820. One terminal of each capacitor 812 is coupled to the output of the amplifier ($ota_n$ or $ota_p$) and the other terminal may be coupled to the ground via a corresponding switch 820. The switches 820 are digitally programmable by the control signal 830. The capacitor array 810 sets the dominant pole (and zero) of the amplifier. The capacitors are referred to ground, and only N channel switches are used, offering a convenient and suitable implementation. As a variation, at least one of the parallel branches in the frequency compensation network 800 in FIG. 8 may use a series combination of at least one capacitor C and at least one resistor R and one switch (with $R_{on} \ll R$).

Capacitor units in the capacitor array 810 may be binary-weighted. Alternatively, a different step ratio (e.g., uniform) may be used. The higher the bandwidth, the smaller the capacitor value required, therefore better integration (e.g., using metal-insulator-metal (MIM) or metal-oxide-metal (MOM) RF optimized capacitors).

Figure 9:
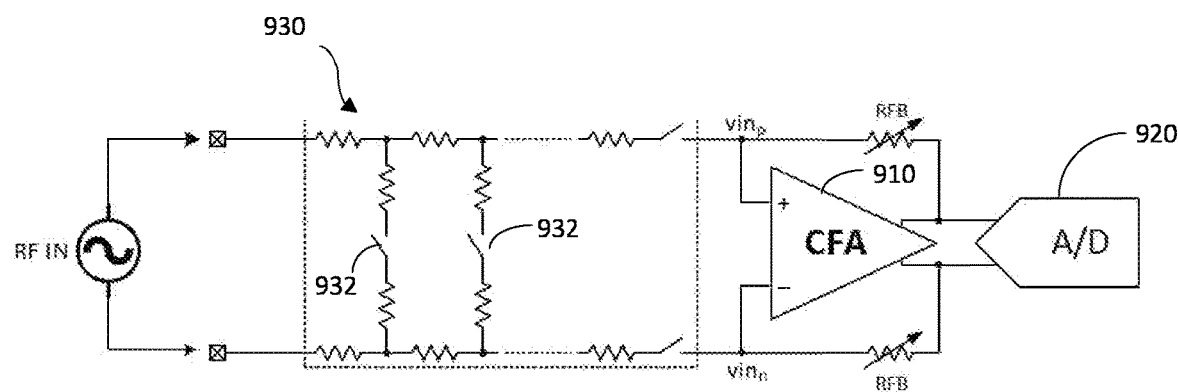
FIG. 9 shows an example implementation of a digital variable gain amplifier using the current feedback amplifier disclosed herein.

FIG. 9 shows an example implementation of a digital variable gain amplifier using the current feedback amplifier 910 disclosed herein. The amplifier 910 (VGA) directly drives an ADC 920 as a direct sampling front-end amplification stage. An RF input signal is coupled to the amplifier 910 (CFA) via the RF input network 930. The RF input network 930 (attenuator circuit) includes two sets of resistive elements coupled in series and shunt paths for selectively coupling two different intermediate nodes between the two series of resistive elements. Each shunt path includes a respective switch 932 for selectively coupling the respective intermediate nodes. The parallel shunt paths placed at the multiple tapping points of the resistor array upstream of the amplifier 910 allow to attenuate the differential input signal for the amplifier 910 with a variable and digitally programmable strength.

The CFA architecture disclosed herein is particularly useful for Fifth Generation (5G) base stations, due to the high level of integration in CMOS technology. It helps to reduce the costs, abate bill of material, lessen overall system complexity (e.g., massive multiple-input multiple-output (MIMO) receiver unit).

Depending on the specific application, some extension(s) (add-ons) can be added to fulfill different requirements. For example, as disclosed above, a source follower may be used as an output buffer to drive low-impedance loads. A double source follower (split-drive boosted switch (feedback closed around signal driver)) may be used. The CFA may be implemented as a digitally programmable variable gain amplifier (VGA) with the RF input network disclosed above. A programmable active filter at RF frequencies may be added as disclosed above. The CFA disclosed herein may be used as a TX off-chip driver (with signal conditioning), for example implementing a variable gain amplifier (TX-VGA), or an active TX-filter, or a combination of both.

The current feedback amplifier (CFA) architecture disclosed herein has several advantages. The example CFAs disclosed herein have high bandwidth capability due to the current-feedback approach. The disclosed CFAs are particularly suitable (and not limited only) for the RF direct sampling application (e.g., a multi-giga samples per second analog-to-digital converter (ADC)). The example CFAs disclosed herein not only have a higher bandwidth than a conventional VFA, but also have an adjustable bandwidth. Instead of a constant gain-bandwidth product, the CFA's bandwidth is primarily a function of the values of the feedback resistor and the compensation capacitance which control the amplifier's frequency response. In the example CFAs, the closed-loop gain (e.g., VGA setting) is based upon the external components in the feedback loop and the gain is essentially independent of frequency (unlike VFA topology). The example CFAs offer superior slew-rate performance, higher driving capability of low impedance loads (e.g., sub-ADCs samplers), providing better linearity (e.g., THD, SFDR). The programmable and independent input/output common-mode voltage control loop of the example CFAs allows to vary the equivalent input transconductance (gm: changing bias current), optimizing input common mode voltage to the input channel (antenna side), while the output common mode voltage can be (independently) chosen to fit comfortably within the input range of the next stage (e.g., an ADC). In example CFAs, the ultra-low ohmic input stage, achieved with common-source second stage closed in local feedback, gives less sensitivity against parasitic (especially capacitances). In example CFAs, due to the current mode (sensing) intrinsic nature, the input stage behaves like a voltage clamp in case an overload situation could appear at the front-end RX channel, proving superior robustness against electrical induced over-stress and better product reliability over life-time.

Figure 10:
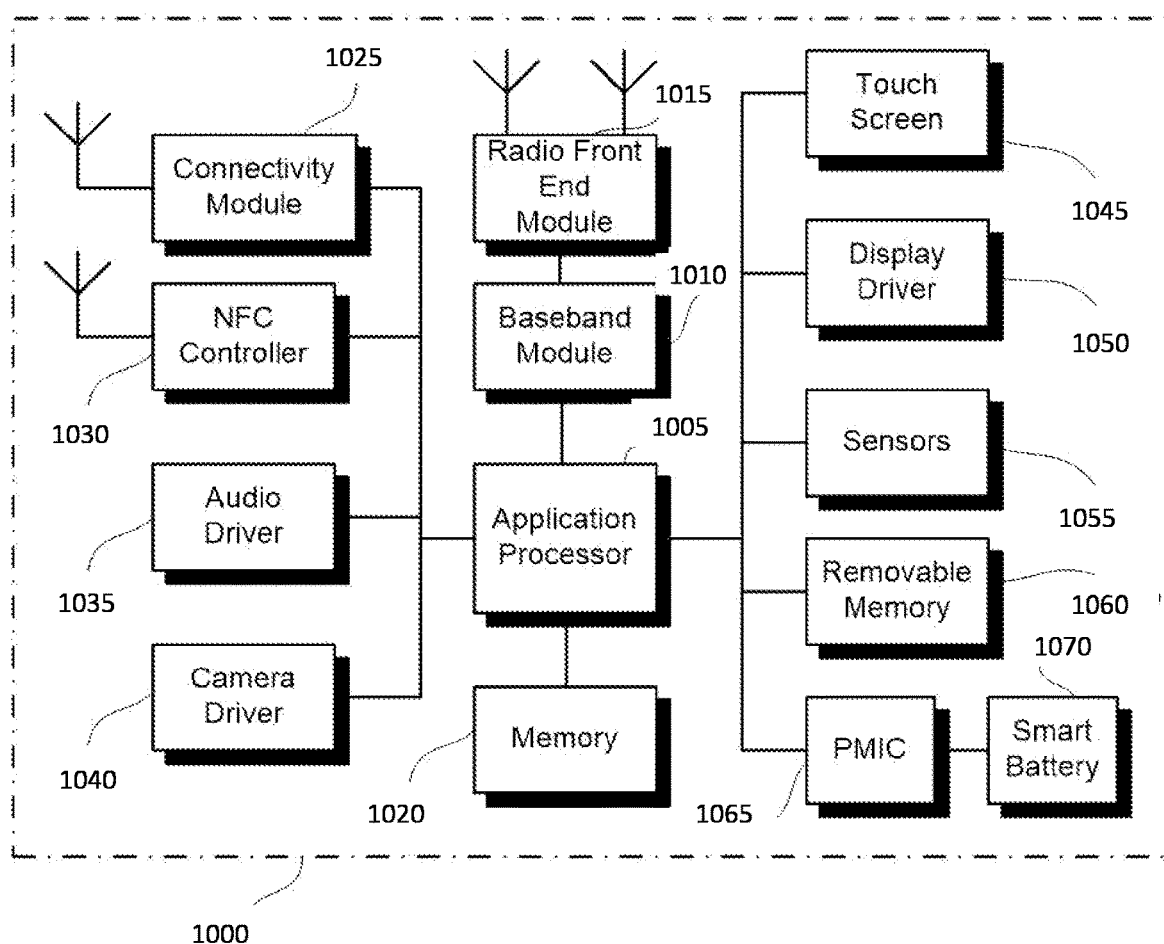
FIG. 10 illustrates a user device in which the examples disclosed herein may be implemented.

FIG. 10 illustrates a user device 1000 in which the examples disclosed herein may be implemented. For example, the examples disclosed herein may be implemented in the radio front-end module 1015, in the baseband module 1010, etc. The user device 1000 may be a mobile device in some aspects and includes an application processor 1005, baseband processor 1010 (also referred to as a baseband module), radio front end module (RFEM) 1015, memory 1020, connectivity module 1025, near field communication (NFC) controller 1030, audio driver 1035, camera driver 1040, touch screen 1045, display driver 1050, sensors 1055, removable memory 1060, power management integrated circuit (PMIC) 1065 and smart battery 1070.

In some aspects, application processor 1005 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1010 may be implemented, for example, as a solder-down substrate including one or more integrated circuits, a single packaged integrated circuit soldered to a main circuit board, and/or a multi-chip module containing two or more integrated circuits.

Figure 11:
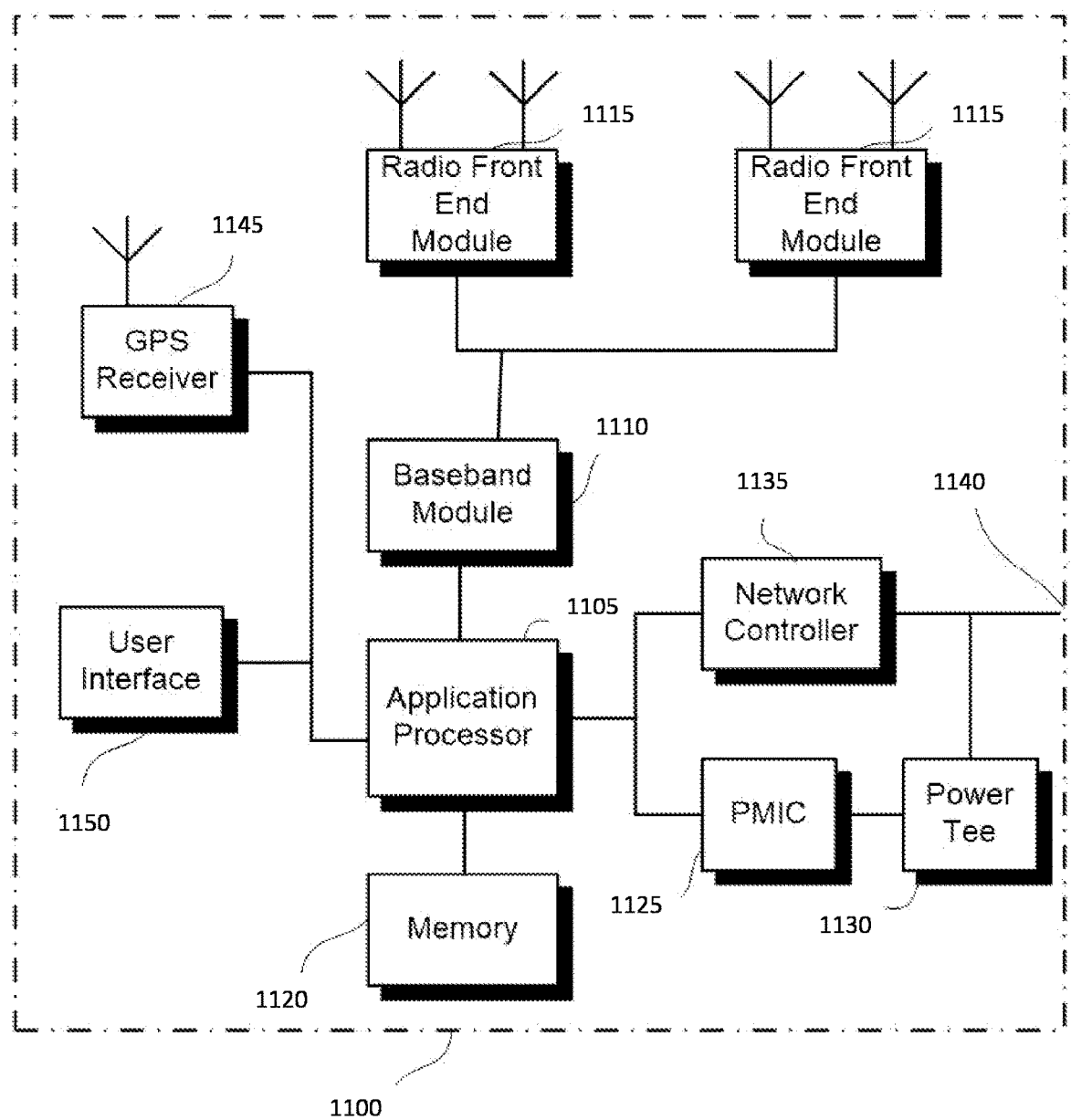
FIG. 11 illustrates a base station or infrastructure equipment radio head in which the examples disclosed herein may be implemented.

FIG. 11 illustrates a base station or infrastructure equipment radio head 1100 in which the examples disclosed herein may be implemented. For example, the examples disclosed herein may be implemented in the radio front-end module 1115, in the baseband module 1110, etc. The base station radio head 1100 may include one or more of application processor 1105, baseband modules 1110, one or more radio front end modules 1115, memory 1120, power management circuitry 1125, power tee circuitry 1130, network controller 1135, network interface connector 1140, satellite navigation receiver module 1145, and user interface 1150.

In some aspects, application processor 1105 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1110 may be implemented, for example, as a solder-down substrate including one or more integrated circuits, a single packaged integrated circuit soldered to a main circuit board or a multi-chip module containing two or more integrated circuits.

In some aspects, memory 1120 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1120 may be implemented as one or more of solder down packaged integrated circuits, socketed memory modules and plug-in memory cards.

In some aspects, power management integrated circuitry 1125 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1130 may provide for electrical power drawn from a network cable to provide both power supply and data connectivity to the base station radio head 1100 using a single cable.

In some aspects, network controller 1135 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1145 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1145 may provide data to application processor 1105 which may include one or more of position data or time data. Application processor 1105 may use time data to synchronize operations with other radio base stations.

In some aspects, user interface 1150 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to a current feedback amplifier. The current feedback amplifier includes a common-gate input stage comprising a first transistor and a second transistor coupled in series, wherein the common-gate input stage is configured to amplify an input signal received at an input node between the first transistor and the second transistor and generate an output at a first output node between the first transistor and a supply voltage node and a second output node between the second transistor and a reference voltage node. The current feedback amplifier may include a biasing circuitry comprising a third transistor and a fourth transistor coupled in series and configured to supply a bias voltage to a gate of the first transistor and a gate of the second transistor of the common-gate input stage to maintain the first transistor and the second transistor of the common-gate input stage in a conducting state. The current feedback amplifier includes a differential pair comprising a first path and a second path coupled in parallel, each of the first path and the second path of the differential pair comprising a fifth transistor and a sixth transistor coupled in series, wherein the first output node of the common-gate input stage is coupled to a gate of the fifth transistor of the first path of the differential pair and the second output node of the common-gate input stage is coupled to the sixth transistor of the first path of the differential pair and an output is generated at an output node between the fifth and sixth transistors in the second path. The common-gate input stage, the differential pair, and the biasing circuitry are coupled in parallel between the supply voltage node and the reference voltage node, and the input node of the common-gate input stage and a node between the fifth transistor and the sixth transistor in the first path of the differential pair are shorted.

Another example (e.g., example 2) relates to a previously described example (e.g., example 1), wherein the common-gate input stage includes a first load between the first transistor of the common-gate input stage and the supply voltage node and a second load between the second transistor of the common-gate input stage and the reference voltage node. The biasing circuitry includes a third load between the third transistor of the biasing circuitry and the supply voltage node and a fourth load between the fourth transistor of the biasing circuitry and the reference voltage node. The differential pair includes a fifth load between the fifth transistor of the differential pair and the supply voltage node and a sixth load between the sixth transistor of the differential pair and the reference voltage node.

Another example (e.g., example 3) relates to a previously described example (e.g., example 2), wherein the first load, the second load, the third load, the fourth load, the fifth load, and the sixth load are resistive loads.

Another example (e.g., example 4) relates to a previously described example (e.g., example 2), wherein the first load, the second load, the third load, the fourth load, the fifth load, and the sixth load are active loads.

Another example (e.g., example 5) relates to a previously described example (e.g., example 4), wherein the current feedback amplifier further includes an input common-mode voltage control loop including an operational amplifier, wherein a non-inverting input terminal of the operational amplifier is coupled to a reference input common-mode voltage and an inverting input terminal of the operational amplifier is coupled to a node between the third and fourth transistors of the biasing circuitry and an output of the operational amplifier is coupled as a control signal to the first, second, third, and fourth loads.

Another example (e.g., example 6) relates to a previously described example (e.g., any one of examples 4-5), wherein the current feedback amplifier further includes an output common-mode voltage control loop including an operational amplifier, wherein a non-inverting input terminal of the operational amplifier is coupled to a reference output common-mode voltage and an inverting input terminal of the operational amplifier is coupled to an output of the current feedback amplifier and an output of the operational amplifier is coupled as a control signal to the fifth and sixth loads.

Another example (e.g., example 7) relates to a previously described example (e.g., any one of examples 4-6), wherein the active loads are a variable current source.

Another example (e.g., example 8) relates to a previously described example (e.g., any one of examples 1-7), wherein the current feedback amplifier further includes an output buffer coupled to the output node of the differential pair.

Another example (e.g., example 9) relates to a previously described example (e.g., example 8), wherein the output buffer is a source follower circuitry.

Another example (e.g., example 10) relates to a previously described example (e.g., any one of examples 8-9), wherein the current feedback amplifier further includes a feedback path for coupling an output node of the output buffer to the input node of the common-gate input stage.

Another example (e.g., example 11) relates to a previously described example (e.g., any one of examples 1-10), wherein the current feedback amplifier further includes a compensation network coupled to the output node of the differential pair.

Another example (e.g., example 12) relates to a previously described example (e.g., example 11), wherein the compensation network comprises a capacitor array comprising a plurality of capacitors coupled in parallel, and a set of switches, wherein each switch is coupled to a corresponding capacitor in series, wherein one terminal of each capacitor is coupled in parallel to a common node coupled to the output node of the differential pair and the other terminal of each capacitor is coupled to a corresponding switch in series, wherein the switches are configured to couple the corresponding capacitor to ground based on a digital control signal.

Another example (e.g., example 13) relates to a previously described example (e.g., example 12), wherein the capacitors are binary-weighted or unary-weighted.

Another example (e.g., example 14) relates to a previously described example (e.g., any one of examples 1-13), wherein the current feedback amplifier has a differential structure such that the common-gate input stage comprises first and second common-gate input stages for receiving differential input signals and the differential pair comprises first and second differential pairs for generating differential output signals, wherein the first and second common-gate input stages and the first and second differential pairs are cross-coupled.

Another example (e.g., example 15) relates to a previously described example (e.g., example 14), wherein the first output node of the first common-gate input state is coupled to a gate of the fifth transistor of the first path of the first differential pair and a gate of the fifth transistor of the second path of the second differential pair, the second output node of the first common-gate input state is coupled to a gate of the sixth transistor of the first path of the first differential pair and a gate of the sixth transistor of the second path of the second differential pair, the first output node of the second common-gate input state is coupled to a gate of the fifth transistor of the second path of the first differential pair and a gate of the fifth transistor of the first path of the second differential pair, and the second output node of the second common-gate input state is coupled to a gate of the sixth transistor of the second path of the first differential pair and a gate of the sixth transistor of the first path of the second differential pair.

Another example (e.g., example 16) relates to a previously described example (e.g., any one of examples 14-15), wherein the current feedback amplifier further includes an input network coupled to the input node of the common-mode input stage.

Another example (e.g., example 17) relates to a previously described example (e.g., example 16), wherein the input network comprises two sets of a plurality of resistive elements coupled in series, and shunt paths for selectively coupling two different intermediate nodes between the two sets of resistive elements, wherein each shunt path includes a respective switch for selectively coupling respective intermediate nodes based on a digital control signal.

Another example (e.g., example 18) relates to a base station including the current feedback amplifier as in any one of examples 1-17.

Another example (e.g., example 19) relates to a user equipment including the current feedback amplifier as in any one of examples 1-17.

Another example (e.g., example 20) relates to an analog-to-digital conversion system, comprising an RF ADC for directly sampling an RF analog signal, and the current feedback amplifier as in any one of claims 1-17 for supplying the RF analog signal to the ADC.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A current feedback amplifier, comprising:
   a common-gate input stage comprising a first transistor and a second transistor coupled in series, wherein the common-gate input stage is configured to amplify an input signal received at an input node between the first transistor and the second transistor and generate an output at a first output node between the first transistor and a supply voltage node and a second output node between the second transistor and a reference voltage node;
   a biasing circuitry comprising a third transistor and a fourth transistor coupled in series and configured to supply a bias voltage to a gate of the first transistor and a gate of the second transistor of the common-gate input stage to maintain the first transistor and the second transistor of the common-gate input stage in a conducting state; and
   a differential pair comprising a first path and a second path coupled in parallel, each of the first path and the second path of the differential pair comprising a fifth transistor and a sixth transistor coupled in series, wherein the first output node of the common-gate input stage is coupled to a gate of the fifth transistor of the first path of the differential pair and the second output node of the common-gate input stage is coupled to the sixth transistor of the first path of the differential pair and an output is generated at an output node between the fifth and sixth transistors in the second path,
   wherein the common-gate input stage, the differential pair, and the biasing circuitry are coupled in parallel between the supply voltage node and the reference voltage node,
   wherein the input node of the common-gate input stage and a node between the fifth transistor and the sixth transistor in the first path of the differential pair are shorted.

2. The current feedback amplifier of claim 1, wherein the common-gate input stage includes a first load between the first transistor of the common-gate input stage and the supply voltage node and a second load between the second transistor of the common-gate input stage and the reference voltage node,
   wherein the biasing circuitry includes a third load between the third transistor of the biasing circuitry and the supply voltage node and a fourth load between the fourth transistor of the biasing circuitry and the reference voltage node,
   wherein the differential pair includes a fifth load between the fifth transistor of the differential pair and the supply voltage node and a sixth load between the sixth transistor of the differential pair and the reference voltage node.

3. The current feedback amplifier of claim 2, wherein the first load, the second load, the third load, the fourth load, the fifth load, and the sixth load are resistive loads.

4. The current feedback amplifier of claim 2, wherein the first load, the second load, the third load, the fourth load, the fifth load, and the sixth load are active loads.

5. The current feedback amplifier of claim 4, further comprising:
   an input common-mode voltage control loop including an operational amplifier, wherein a non-inverting input terminal of the operational amplifier is coupled to a reference input common-mode voltage and an inverting input terminal of the operational amplifier is coupled to a node between the third and fourth transistors of the biasing circuitry and an output of the operational amplifier is coupled as a control signal to the first, second, third, and fourth loads.

6. The current feedback amplifier of claim 4, further comprising:
   an output common-mode voltage control loop including an operational amplifier, wherein a non-inverting input terminal of the operational amplifier is coupled to a reference output common-mode voltage and an inverting input terminal of the operational amplifier is coupled to an output of the current feedback amplifier and an output of the operational amplifier is coupled as a control signal to the fifth and sixth loads.

7. The current feedback amplifier of claim 4, wherein the active loads are a variable current source.

8. The current feedback amplifier of claim 1, further comprising:
   an output buffer coupled to the output node of the differential pair.

9. The current feedback amplifier of claim 8, wherein the output buffer is a source follower circuitry.

10. The current feedback amplifier of claim 8, further comprising:
    a feedback path for coupling an output node of the output buffer to the input node of the common-gate input stage.

11. The current feedback amplifier of claim 1, further comprising:
    a compensation network coupled to the output node of the differential pair.

12. The current feedback amplifier of claim 11, wherein the compensation network comprises:
    a capacitor array comprising a plurality of capacitors coupled in parallel; and
    a set of switches, wherein each switch is coupled to a corresponding capacitor in series,
    wherein one terminal of each capacitor is coupled in parallel to a common node coupled to the output node of the differential pair and the other terminal of each capacitor is coupled to a corresponding switch in series, wherein the switches are configured to couple the corresponding capacitor to ground based on a digital control signal.

13. The current feedback amplifier of claim 12, wherein the capacitors are binary-weighted or unary-weighted.

14. The current feedback amplifier of claim 1, wherein the current feedback amplifier has a differential structure such that the common-gate input stage comprises first and second common-gate input stages for receiving differential input signals and the differential pair comprises first and second differential pairs for generating differential output signals, wherein the first and second common-gate input stages and the first and second differential pairs are cross-coupled.

15. The current feedback amplifier of claim 14, wherein the first output node of the first common-gate input stage is coupled to the gate of the fifth transistor of the first path of the first differential pair and a gate of the fifth transistor of the second path of the second differential pair, the second output node of the first common-gate input stage is coupled to a gate of the sixth transistor of the first path of the first differential pair and a gate of the sixth transistor of the second path of the second differential pair, the first output node of the second common-gate input stage is coupled to a gate of the fifth transistor of the second path of the first differential pair and a gate of the fifth transistor of the first path of the second differential pair, and the second output node of the second common-gate input stage is coupled to a gate of the sixth transistor of the second path of the first differential pair and a gate of the sixth transistor of the first path of the second differential pair.

16. The current feedback amplifier of claim 14, further comprising: an input network coupled to the input node of the common-gate input stage.

17. The current feedback amplifier of claim 16, wherein the input network comprises:

two sets of a plurality of resistive elements coupled in series; and shunt paths for selectively coupling two different intermediate nodes between the two sets of resistive elements, wherein each shunt path includes a respective switch for selectively coupling respective intermediate nodes based on a digital control signal.

18. A base station including the current feedback amplifier of claim 1.

19. A user equipment including the current feedback amplifier of claim 1.

20. An analog-to-digital conversion system, comprising:

a radio frequency (RF) analog-to-digital converter (ADC) for directly sampling an RF analog signal; and the current feedback amplifier of claim 1 for supplying the RF analog signal to the ADC.

* * * * *